(12) United States Patent
Hou et al.

(10) Patent No.: US 9,752,057 B2
(45) Date of Patent: Sep. 5, 2017

(54) CMP METHOD FOR SUPPRESSION OF TITANIUM NITRIDE AND TITANIUM/TITANIUM NITRIDE REMOVAL

(71) Applicant: Cabot Microelectronics Corporation, Aurora, IL (US)

(72) Inventors: Hui-Fang Hou, Pingtung (TW); William Ward, Glen Ellyn, IL (US); Ming-Chih Yeh, Taipei County (TW); Chih-Pin Tsai, Kaohsiung (TW)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/616,250

(22) Filed: Feb. 6, 2015

(65) Prior Publication Data
US 2015/0221521 A1    Aug. 6, 2015

Related U.S. Application Data

(60) Provisional application No. 61/936,099, filed on Feb. 5, 2014.

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |
| *C09G 1/02* | (2006.01) |
| *H01L 21/321* | (2006.01) |
| *C23F 3/06* | (2006.01) |
| *H01L 21/3105* | (2006.01) |
| *C09K 3/14* | (2006.01) |

(52) U.S. Cl.
CPC .............. *C09G 1/02* (2013.01); *C09K 3/1463* (2013.01); *C23F 3/06* (2013.01); *H01L 21/31053* (2013.01); *H01L 21/31058* (2013.01); *H01L 21/3212* (2013.01)

(58) Field of Classification Search
USPC .......................................... 216/89; 438/693
See application file for complete search history.

(56) References Cited

U.S. PATENT DOCUMENTS

| 6,432,828 | B2 * | 8/2002 | Kaufman et al. ............. 438/693 |
|---|---|---|---|
| 2002/0023389 | A1 * | 2/2002 | Minamihaba ............ C09G 1/02 51/308 |
| 2007/0293049 | A1 | 12/2007 | Minamihaba et al. |
| 2009/0209103 | A1 * | 8/2009 | Monnoyer .......... H01L 21/3212 438/693 |
| 2012/0094489 | A1 * | 4/2012 | Moeggenborg .......... C09G 1/02 438/692 |

FOREIGN PATENT DOCUMENTS

| JP | 2006261333 A | 9/2006 |
|---|---|---|
| TW | 200838996 A | 10/2008 |
| TW | 201139633 A | 11/2011 |

OTHER PUBLICATIONS

Korean Intellectual Property Office as International Searching Authority, The International Search Report and The Written Opinion of the International Searching Authority, issued in connection with Patent Application No. PCT/US2015/014815 dated May 29, 2015.
Taiwan Intellectual Property Office, Search Report issued in connection with Taiwan Patent Application No. 104105194 dated Feb. 23, 2016.

\* cited by examiner

*Primary Examiner* — Roberts Culbert
(74) *Attorney, Agent, or Firm* — Thomas Omholt; Erika S. Wilson

(57) ABSTRACT

A chemical mechanical polishing (CMP) method for removal of a metal layer deposited over a titanium nitride (TiN) or titanium/titanium nitride (Ti/TiN) barrier layer is described herein. The method comprises abrading the metal layer with an acidic CMP composition to expose the underlying TiN or Ti/TiN layer, wherein the TiN or Ti/N layer is polished at a low rate due to the presence of a surfactant inhibitor. The acidic CMP composition comprises a particulate abrasive (e.g., silica, alumina) suspended in a liquid carrier containing a surfactant selected from the group consisting of an anionic surfactant, a nonionic surfactant, cation surfactants, and a combination thereof.

8 Claims, 5 Drawing Sheets

CMP METHOD FOR SUPPRESSION OF TITANIUM NITRIDE AND TITANIUM/TITANIUM NITRIDE REMOVAL

FIELD OF THE INVENTION

This invention relates to chemical mechanical polishing (CMP) compositions and methods. More particularly, this invention relates to CMP methods for suppressing removal of titanium nitride and titanium/titanium nitride barrier layers and CMP compositions therefor.

BACKGROUND

In manufacturing of advanced semiconductor devices (both memory and logic) certain integration schemes require a selective removal of a metals (e.g., Cu, CuMn, Ta, TaN, Al, AlCo, Co, CoMo, Ru, RuTa, RuTiN, Mn, TiN (Self-stop), W, Pt) or dielectrics (e.g., silicon oxide, silicon nitride, silicon carbide, polysilicon) or polymers (e.g., PR, SOG type oxide) with cessation of removal upon reaching a barrier layer (commonly referred to as "stop on barrier"). Compositions and methods for chemical mechanical polishing (CMP) of the surface of a substrate are well known in the art. Polishing compositions (also known as polishing slurries, CMP slurries, and CMP compositions) for CMP of surfaces of semiconductor substrates (e.g., for integrated circuit manufacture) typically contain an abrasive, various additive compounds, and the like. In the case of barrier layers formed from titanium nitride (TiN) and titanium/titanium nitride (Ti/TiN), the stop on barrier process can be difficult, since typical CMP compositions are not particularly selective for removal of the overlying metal layer relative to the TiN or Ti/TiN layer.

One particular application of the stop on barrier technique is in tungsten (W) gate formation, which involves CMP removal of a W layer disposed on a barrier layer over an oxide substrate. A depression in oxide substrate is lined with a portion of the barrier layer and filled with the W metal. During polishing, the W layer is removed by CMP down to a planar portion of the barrier layer. A portion of W within depression then is removed by etching to form a gate structure. One major difficulty in the stop on barrier technique is undesired removal of the planar portion of the barrier layer, which can lead to a lower gate height or other problems. Often, CMP compositions are not selective enough to reliably and consistently stop material removal when the barrier layer is exposed.

In view of the difficulties encountered in metal removal over a TiN or Ti/TiN barrier, there is an ongoing need for CMP compositions and methods that achieve effective metal removal while suppressing Ti/TiN barrier removal. The methods and compositions described herein address this need.

BRIEF SUMMARY OF THE INVENTION

A chemical mechanical polishing (CMP) method for removing a metal, dielectric or polymer layer deposited over a TiN or Ti/TiN barrier layer is described herein. The method comprises abrading away the metals (e.g., Cu, CuMn, Ta, TaN, Al, AlCo, Co, CoMo, Ru, RuTa, RuTiN, Mn, TiN (Self-stop), W, Pt) or dielectrics (e.g., silicon oxide, silicon nitride, silicon carbide, polysilicon) or polymers (e.g., PR, SOG type oxide) with an acidic CMP composition (e.g., in conjunction with a polishing pad in a CMP polishing apparatus). The CMP composition comprises a particulate abrasive (e.g., silica, alumina) suspended in a liquid carrier containing a surfactant selected from the group consisting of an anionic surfactant, a cationic surfactant, a nonionic surfactant, and a combination thereof. The method is particularly useful for stop-on-barrier polishing of substrates comprising a TiN or Ti/TiN barrier layer. The surfactant surprisingly aids in suppression of TiN and Ti/TiN removal while not interfering with metals, dielectrics or polymers removal.

In some embodiments the CMP composition comprises about 0.001 to about 10 percent by weight (wt %) of the particulate abrasive. Some examples of particulate abrasives include colloidal silica with a mean particle size of about 10 to about 300, and alumina with a mean particle size of about 10 to about 300. The pH of the CMP composition preferably is in the range of about 2 to about 7. The surfactant can be present in the CMP composition, e.g., at a concentration in the range of about 10 to about 50,000 parts-per-million (ppm).

In some preferred embodiments the CMP composition further comprises an oxidizing agent (e.g., hydrogen peroxide), for example, about 0 to about 5 wt % of hydrogen peroxide.

In some embodiments, the surfactant can comprise an anionic surfactant such as a sulfonate surfactant, a sulfate surfactant, phosphonate surfactant (e.g., an alkyl phosphonate), and a phosphate surfactant (e.g., an alkyl phosphate monoester or diester, or an ethoxylated alkyl phosphate). Alternatively, or in addition, the surfactant can comprise a nonionic surfactant such as an alkyne diol surfactant. Some preferred anionic surfactants include, e.g., an anionic sulfonate surfactant, such as an alkylaryl sulfonate (e.g., an alkylbenzene sulfonate such as dodecylbenzene sulfonate), a monoalkyl sulfosuccinate, and a dialkyl sulfosuccinate.

In a preferred embodiment, the CMP composition comprises about 0.001 to about 10 wt % of a silica or alumina abrasive, about 10 to about 50,000 ppm of a sulfonate surfactant, and about 0 to about 5 wt % of hydrogen peroxide in an aqueous carrier at a pH in the range of about 2 to about 7. The sulfonate surfactant preferably comprises an alkylbenzene sulfonate surfactant such as dodecylbenzene sulfonate and/or a monoalkyl or dialkyl sulfosuccinate surfactant.

In another preferred embodiment, the CMP composition comprises about 0.001 to about 10 wt % of a silica or alumina abrasive, about 10 to about 50,000 ppm of a nonionic surfactant, and about 0 to about 5 wt % of hydrogen peroxide in an aqueous carrier at a pH in the range of about 2 to about 7. The nonionic surfactant preferably comprises an alkyne diol surfactant (e.g., an acetylenic diol, an ethoxylate thereof, an ethoxylate-propoxylate thereof, or a combination of two or more of the foregoing).

The compositions and methods described herein advantageously provide excellent selectivity for metal removal relative to TiN and Ti/TiN. In particular, anionic and nonionic surfactants surprisingly aid in suppression of TiN and Ti/TiN removal while still allowing for acceptable metal removal rates.

DETAILED DESCRIPTION OF THE INVENTION

Figure 1:
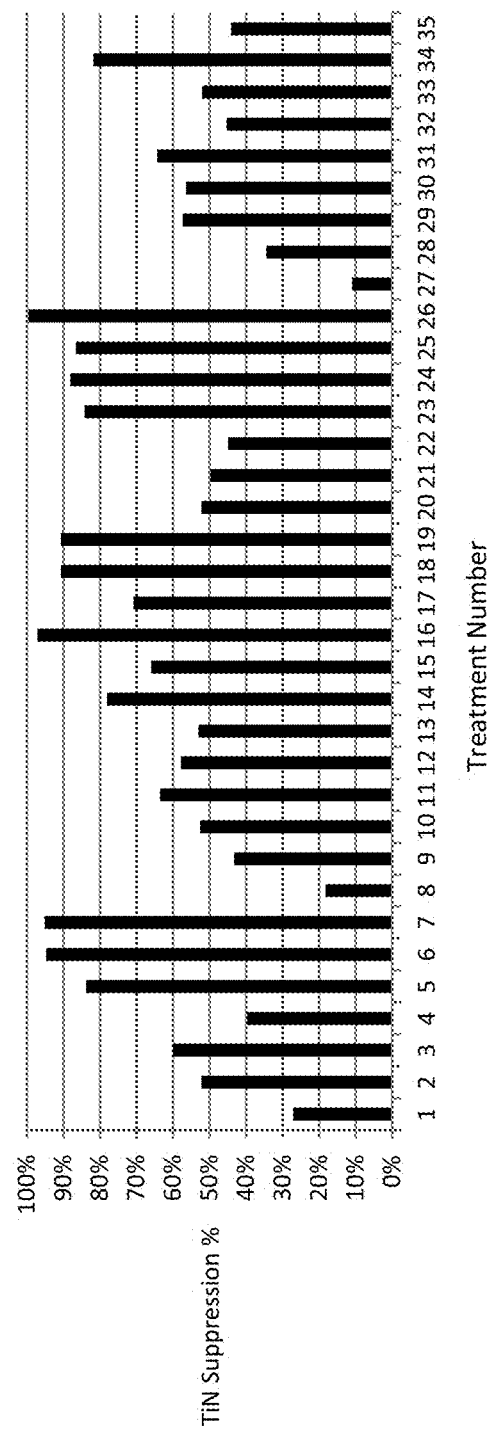
FIG. 1 provides graphs of TiN removal rate (RR) suppression (%) observed upon polishing of TiN blanket wafers with CMP compositions comprising various anionic and nonionic surfactants.

The CMP compositions useful in the methods described herein include a particulate abrasive and a surfactant in an aqueous carrier. The compositions surprisingly result in suppressing TiN and Ti/TiN removal rates while still providing an acceptable rate of removal for metal (e.g., Cu, CuMn, Ta, TaN, Al, AlCo, Co, CoMo, Ru, RuTa, RuTiN, Mn, TiN (Self-stop), W, Pt) or dielectric (e.g., silicon oxide, silicon nitrides, silicon carbides, polysilicon) or polymer (e.g., PR, SOG type oxide) removal.

The surfactant component of the CMP composition can comprise an anionic surfactant, a cationic surfactant, a nonionic surfactant, or combinations thereof. The compositions can comprise a single surfactant, multiple surfactants from a single surfactant class (or subclass), or optionally can comprise a combination of two or more surfactants from different surfactant classes (or subclasses), as described herein. The surfactant may be in the composition at a concentration of at least about 10 ppm, for example, at least about 25 ppm, at least about 50 ppm, at least about 100 ppm, at least about 500 ppm, at least about 1000 ppm, or at least about 2,000 ppm. Additionally, the surfactant may be in the composition at a concentration of no more than about 50,000 ppm, for example, about 40,000 ppm, about 30,000 ppm, about 20,000 ppm, about 10,000 ppm or about 5,000 ppm. Typically, the surfactant is present in the CMP composition at a concentration in the range of about 10 to about 50,000 ppm, preferably about 50 to about 5000 ppm.

Preferably, anionic surfactants are selected from the general classes of phosphonate surfactants, phosphate surfactants, sulfonate surfactants, and sulfate surfactants. The terms "phosphonate", "phosphate", "sulfonate", and "sulfate", as used herein refer to ionized (anion) forms of the surfactants, which include at least one anionic oxygen, as well as to the acid forms of the surfactants, which include at least one acidic OH group. As is well known in the art, the acid forms of many sulfur and phosphorus-based surfactants generally are highly acidic and will tend to be ionized even at relatively low pH values (e.g., pH 2 to 3). Thus, the anionic surfactants in the CMP compositions of the present invention will generally be present predominately in the anionic form regardless of whether the surfactant was added to the composition in a salt form or acid form.

Non-limiting examples subclasses of sulfonate surfactants useful in the CMP compositions described herein include alkylaryl sulfonates (e.g., alkylbenzene sulfonates such as dodecylbenzene sulfonate), alkyl sulfonates (e.g., alkenyl sulfonates such as alpha-olefin sulfonates, alkylglyceride sulfonates, alkylether sulfonates and alkyl sulfoacetates), sulfosuccinates (e.g., monoalkyl sulfosuccinates, and dialkyl sulfosuccinates), acyl taurates, and acyl isethionates.

Alkylaryl sulfonates are one preferred class of anionic surfactants. The alkyl group can be attached to the aryl (e.g., benzene) moiety in any position relative to the sulfonic acid group. The alkyl group generally will include more than 6 carbon atoms, and can be linear or branched. A branched alkyl group can be attached to the aryl moiety through a primary carbon (e.g., a methylene group), a secondary carbon, or a tertiary carbon. A preferred alkylaryl sulfonate is dodecylbenzene sulfonate, in which the dodecyl group can be any alkyl group having a total of twelve carbons, and therefore can be linear or branched. A branched dodecyl group can be attached to the benzene moiety through a primary carbon (e.g., a methylene group), a secondary carbon, or a tertiary carbon. Preferably, the dodecyl group comprises a linear dodecyl chain attached to the benzene group via a secondary carbon atom (i.e., internally along the dodecyl chain rather than at one end of the chain).

As will be readily understood by those of ordinary skill in the chemical arts, the surfactant in a given CMP composition generally will be selected to be stable at the storage pH of the CMP composition. Consequently, preferred anionic surfactant classes are phosphonate and sulfonate surfactants (i.e., surfactants in which the hydrophobic portion of the surfactant is bound to the hydrophilic S or P group by a C—S or C—P bond), as opposed to phosphates and sulfates, which tend to have stability issues at acidic pH due to ester linkage between hydrophobic portion and hydrophilic portion of the surfactant. In addition, preferred sulfonate and phosphonate surfactants are materials in which the hydrophobic portion includes relatively acid stable bonds (i.e., C—C bonds ethers, and amides, and in some cases carboxylic ester groups). Some examples of relatively acid stable sulfonates include, e.g., alkylaryl sulfonates, alkenyl sulfonates, alkylether sulfonates, acyl taurates, monoalkyl sulfosuccinates, and dialkyl sulfosuccinates.

Preferred nonionic surfactants include alkylaryl alcohols, alkynols, and alkyne diols (also commonly referred to as acetylenic diol surfactants), including alkyne diol materials such as such as 2,5,8,11-tetramethyl-6-dodecyne-5,8-diol, 2,4,7,9-tetramethyl-5-decyne-4,7-diol, and the like, as well as ethoxylated alkyne diols and ethoxylated-propoxylated alkyne diols. For example, alkyne diol surfactants can be represented by the following Formulas I and II, in which $R^1$ and $R^4$ are linear or branched alkyl chains comprising from 3 to 10 carbon atoms; $R^2$ and $R^3$ are either H or an alkyl chain comprising 1 to 5 carbon atoms, and m, n, p, and q are numbers with an average value in the range of 0 to about 20. Examples of such alkyne diol surfactants and their preparation are described, e.g., in U.S. Pat. No. 6,641,896 to Zhang et al.

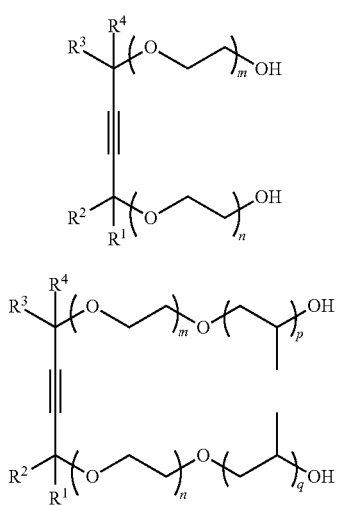

The particulate abrasive can be any abrasive suitable for use in CMP applications, e.g., $SiO_2$ (silica), $Al_2O_3$ (alumina), $CeO_2$ (ceria), $ZnO_2$ (zirconia), or $MnO_2$. The abrasive can have any suitable average particle size (i.e., average particle diameter). The abrasive can have an average particle size of 4 nm or more, 10 nm or more, 15 nm or more, 20 nm or more, or 25 nm or more. Alternatively, or in addition, the abrasive can have an average particle size of 300 nm or less, 150 nm or less, 120 nm or less, 110 nm or less, 100 nm or less, 90 nm or less, 80 nm or less, 70 nm or less, 60 nm or less, 50 nm or less, or 40 nm or less. Thus, the abrasive can have an average particle size bounded by any two of the above endpoints. For a non-spherical particle, the size of the particle is the diameter of the smallest sphere that encompasses the particle. In some preferred embodiments, the abrasives are selected from silica (e.g., colloidal silica) and alumina. Preferably, the particulate abrasive has a mean particle size of about 10 to about 300 nm. Preferred colloidal silica abrasives have an average particle size in the range of about 10 to about 300 nm, preferably about 10 to about 150 nm. The silica particles can be generally spherical, oblate spherical, dumb bell shaped, or cocoon. A preferred alumina abrasive having a mean particle size of about 10 to about 300 nm, more preferably about 10 to about 150 nm.

The polishing composition can contain 0.001 wt. % or more, 0.1 wt. % or more, 0.25 wt. % or more, or 0.5 wt. % or more of abrasive. Alternatively, or in addition, the polishing composition can contain 10 wt. % or less, 5 wt. % or less, 4 wt. % or less, 3 wt. % or less, or 2 wt. % or less of abrasive. Thus, the polishing composition can comprise abrasive in an amount bounded by any two of the above endpoints recited for the abrasive. The abrasive typically is present in the CMP composition at a concentration in the range of about 0.001 to about 10 wt %, preferably about 0.001 to about 5 wt %. Preferably, the abrasive is present in the CMP composition at a concentration of about 0.001 to about 10 wt % (e.g., about 0.001 to about 5 wt %). At point of use during a polishing method as described herein the abrasive preferably is present in the CMP composition at a concentration of about 0.001 to about 5 wt % (e.g., about 0.001 to about 2 wt %).

Desirably, the silica abrasive will have a zeta potential of greater than 0 mV at pH of 2.3, in the polishing composition. The zeta potential of a particle refers to the difference between the electrical charge of the ions surrounding the particle and the electrical charge of the bulk solution (e.g., the liquid carrier and any other components dissolved therein).

The compositions of the present invention have an acidic pH, i.e., a pH less than about 7. In some embodiments the pH may be in the range of about 2 up to about 7, for example about 2 to about 6, for example about 3 to about 5. Preferably, the pH is in the range of about 2 to about 5. The pH of the composition can be achieved and/or maintained by inclusion of a buffering material including an acidic component, which can comprise any inorganic or organic acid. Preferably, the acidic pH is maintained by an organic or inorganic buffer comprising basic and acidic components in amounts and ratios suitable to achieve the desired pH. Acidic buffers are well known to those of ordinary skill in the chemical arts.

In some preferred embodiments the CMP composition further comprises an oxidizing agent, such as, for example, hydrogen peroxide, optionally in combination with a metal ion (e.g., ferric ion). The polishing composition can contain any suitable amount of oxidizing agent. The polishing composition can contain 0.05 wt. % or more, 0.1 wt. % or more, or 0.25 wt. % or more of oxidizing agent. Alternatively, or in addition, the polishing composition can contain 5 wt. % or less, 2.5 wt. % or less, 1 wt. % or less, 0.8 wt. % or less, or 0.6 wt. % or less of oxidizing agent. Thus, the polishing composition can comprise the oxidizing agent in an amount bounded by any two of the above endpoints recited for the oxidizing agent. In some embodiments, the CMP composition comprises about 0 to about 5 wt % of hydrogen peroxide, at point of use.

In conventional CMP techniques, a substrate carrier or polishing head is mounted on a carrier assembly and positioned in contact with a polishing pad in a CMP apparatus. The carrier assembly provides a controllable pressure to the substrate, urging the substrate against the polishing pad. The pad and carrier, with its attached substrate, are moved relative to one another. The relative movement of the pad and substrate serves to abrade the surface of the substrate to remove a portion of the material from the substrate surface, thereby polishing the substrate. The polishing of the substrate surface typically is further aided by the chemical activity of the polishing composition (e.g., by oxidizing agents, acids, bases, or other additives present in the CMP composition) and/or the mechanical activity of a particulate abrasive suspended in the polishing composition.

The polishing compositions of the invention optionally also can include suitable amounts of one or more other additive materials commonly included in polishing compositions, such as metal complexing agents, dispersants, stabilizers, corrosion inhibitors, viscosity modifying agents, biocides, cationic surfactants, nonionic surfactants, inorganic salts, and the like. For example, the composition can include a biocide such as KATHON® or NEOLONE® biocides; a complexing agent such as acetic acid, histidine, lysine, glycine, picolinic acid, tartaric acid, iminodiacetic acid, alanine, benzoic acid, nitrilotriacetic acid (NTA), glutamic acid, glutaric acid, beta-alanine, aspartic acid, ornithine, or proline; a corrosion inhibitor such as benzotriazole (BTA), 1,2,3-triazole, 1,2,4-triazole, a tetrazole (i.e. 5-aminotetrazole), 3-amino-1,2,4-triazole, phenylphosphonic acid, methylphosphonic acid; and the like. In some embodiments, the CMP composition can include a water soluble salt, e.g., ammonium nitrate for profile control and conductivity. For example, the composition can include about 50 to about 2000 ppm of the water soluble salt. The CMP composition also can include a cationic surfactant that can selectively bind to silicon oxide relative to silicon nitride to further aid in silicon nitride removal selectivity.

The aqueous carrier can be any aqueous solvent, e.g., water, aqueous methanol, aqueous ethanol, a combination thereof, and the like. Preferably, the aqueous carrier comprises, consists essentially of, or consists of water, more preferably deionized water.

The polishing compositions used in the methods described herein can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., abrasive, polymer, chelating agents, buffers, and the like), as well as any combination of ingredients. For example, the ceria abrasive can be dispersed in water, combined with the polymer components, and mixed by any method that is capable of incorporating the components into the polishing composition. Typically, an oxidizing agent, when utilized, is not added to the polishing composition until the composition is ready for use in a CMP process, for example, the oxidizing agent can be added just prior to initiation of polishing. The pH can be further adjusted at any suitable time by addition of an acid or base, as needed.

The polishing compositions of the present invention also can be provided as a concentrate, which is intended to be diluted with an appropriate amount of aqueous solvent (e.g., water) prior to use. In such an embodiment, the polishing composition concentrate can include the various components dispersed or dissolved in aqueous solvent in amounts such that, upon dilution of the concentrate with an appropriate amount of aqueous solvent, each component of the polishing composition will be present in the polishing composition in an amount within the appropriate range for use.

The CMP methods of the invention preferably are achieved using a chemical-mechanical polishing apparatus. Typically, the CMP apparatus comprises a platen, which, when in use, is in motion and has a velocity that results from orbital, linear, and/or circular motion, a polishing pad in contact with the platen and moving relative to the platen when in motion, and a carrier that holds a substrate to be polished by contacting and moving relative to the surface of the polishing pad. The polishing of the substrate takes place by the substrate being placed in contact with the polishing pad and a polishing composition of the invention and then moving the polishing pad relative to the substrate, so as to abrade at least a portion of the substrate to polish the substrate.

The following examples further illustrate certain aspects of the invention but, of course, should not be construed as in any way limiting its scope. As used herein and in the following examples and claims, concentrations reported as parts-per-million (ppm) or percent by weight (wt %) are based on the weight of the active component of interest divided by the weight of the composition.

The following non-limiting examples are provided to further illustrate certain aspects and features of the compositions and methods described herein.

EXAMPLE 1

This example illustrates the effect of different surfactants on TiN removal rate suppression.

The abrasives used in this, and following examples, are summarized in Table 1.

TABLE 1

| Abrasive | Abrasive Type | Shape | Zeta Pot. at pH 2.3 | Ave Particle Size |
| --- | --- | --- | --- | --- |
| A | Alumina | Spherical | −15.1 | 100 nm |
| B | Colloidal Silica | Cocoon | 4.83 | 25 nm |
| C | Colloidal Silica | Cocoon | 3.82 | 35 nm |
| D | Colloidal Silica | Cocoon | 6.4 | 50 nm |
| E | Colloidal Silica | Cocoon | 12.1 | 70 nm |
| F | Colloidal Silica | Spherical | 1.19 | 50 nm |
| G | Colloidal Silica | spherical | 5.1 | 70 nm |
| H | Colloidal Silica | Cocoon | 7.35 | 50 nm |
| I | Colloidal Silica | Cocoon | 38.4 | 35 nm |
| J | Colloidal Silica | Cocoon | 50.9 | 50 nm |

Aqueous CMP compositions having a pH of about 2.3 and comprising about 0.025 percent by weight (wt %) of colloidal silica (Abrasive J from Table 1, Fuso Chemical Co. Ltd.), about 0.5 wt % hydrogen peroxide and about 1000 ppm (actives concentration) of the various surfactants listed in Table 1, with the balance being water, were prepared. TiN blanket wafers were polished with the various compositions for 60 seconds using a Fujibo H7000 polishing pad and the following polishing parameters: carrier speed of 111 rpm, platen speed of 113 rpm, down force of 1.5 psi and slurry flow rate of 150 mL The amount of TiN removal observed with each composition was compared to the amount of TiN removal observed upon polishing of a TiN blanket wafer with a comparative CMP composition (control) having the same basic formulation as the test compositions, but without any added surfactant. The TiN removal rate (RR) suppression was calculated by subtracting the removal rate for the test composition from the removal rate for the control and expressing the difference as a percentage of the control.

FIG. 1 provides graphs of the observed TiN RR suppression (%) for the various anionic and nonionic surfactants. Evaluations of surfactant inhibitors and various non-surfactant additives (e.g., amino acids and triazoles) indicated that the non-surfactant additives were not suitable for providing the desired suppression of TiN RR. In some instances, particularly for sulfate, sulfonate, phosphate, alkylaryl alcohol, amide, and alkyne diol surfactants, TiN RR suppression of greater than 80% was observed (see e.g., results for SINONATE 1105SF (5), SINONATE 290MH (6), ZETASPERSE 2300 (7), DBS (16), OLFINE WE-001 (18), OLFINE WE-003 (19), SURFYNOL 604 (23), SURFYNOL 707P (24), SINOPOL 9620P (25), poly(acrylamide) (34), and RHODAFAC RS710 (26) in FIG. 1.

TABLE 2

| Treatment Number | Active Component | Tradename (CAS*) | Type | Functional Group |
| --- | --- | --- | --- | --- |
| 1 | (Ammonium P.O.E styrenated aryl ether sulfate) | SINONATE ® 707SF (104042-66-2) | anionic | Sulfate |
| 2 | Polyoxyethylene nonylphenyl ether sulfate ammonium salt | SINONATE ® 960SF (9051-57-4) | anionic | Sulfate |
| 3 | Polyoxyethylene nonylphenyl ether sulfate ammonium salt | SINONATE ® 962SF (9051-57-4) | anionic | Sulfate |

TABLE 2-continued

| Treatment Number | Active Component | Tradename (CAS*) | Type | Functional Group |
|---|---|---|---|---|
| 4 | Sodium 2-ethylhexyl sulfate | SINONATE ® EHS (126-92-1) | anionic | Sulfate |
| 5 | Ammonium lauryl polyoxyethylene ether sulfate | SINONATE ® 1105SF (9004-82-4) | anionic | Sulfate |
| 6 | Sodium dialkyl sulfosuccinate | SINONATE ® 290MH (36409-57-1) | anionic | Sulfonate |
| 7 | Mixture of (C10-C14) alkylbenzene sulfonate and ethoxylated (C6-C12) alcohols | ZETASPERSE ® 2300 | anionic | Sulfonate |
| 8 | α-Sulfo-ω-(1-((4-nonylphenoxy) methyl)-2-(2-propenyloxy) ethoxy)-Poly(oxy-1,2-ethanediyl), ammonium salt | RES-10A (403983-53-9) | anionic | Sulfonate |
| 9 | Poly(oxy-1,2-ethanediyl), alpha-sulfo-omega-[1-hydroxymethyl)-2-(2-propenyloxy) ethoxyl]-, C11-rich C10-14-branched alkyl ethers, ammonium salts | ADEKA REASOAP SR-10 (905843-50-7 and 403983-53-9) | anionic | Sulfonate |
| 10 | Benzenesulfonic acid, decyl (sulfophenoxy)-, disodium salt | DOWFAX ® C6L (147732-60-3) | anionic | Sulfonate |
| 11 | Benzenesulfonic acid, decyl (sulfophenoxy)-, disodium salt | DOWFAX ® C10L (36445-71-3) | anionic | Sulfonate |
| 12 | Benzenesulfonic acid, decyl(sulfophenoxy)-, sodium salt (1:2)] | DOWFAX ® 3B2 (36445-71-3) | anionic | Sulfonate |
| 13 | Benzene, 1,1'-oxybis-, tetrapropylene derivs., sulfonated, sodium salts | DOWFAX ® 2A1 (119345-04-9) | anionic | Sulfonate |
| 14 | Disodium hexadecyldiphenyloxide disulfonate | DOWFAX ® 8390 TSF-20 (65143-89-7) | anionic | Sulfonate |
| 15 | Poly(styrene sulfonic acid), M.W. 75,000 | PSS 75K (28210-41-5) | anionic | Sulfonate |
| 16 | (C10-C16)alkyl benzene sulfonic acid, DBS | (68584-22-5) | anionic | Sulfonate |
| 17 | poly(2-acrylamido-2-methyl-1-propanesulfonic acid) | ALCOSPERSE ® 510 | anionic | Sulfonate |
| 18 | 2,4,7,9-Tetramethyldec-5-yne-4,7-diol | OLFINE WE-001 | anionic | alkyne diol |
| 19 | 2,4,7,9-Tetramethyldec-5-yne-4,7-diol | OLFINE ® WE-003 | anionic | alkyne diol |
| 20 | 3,5-Dimethlyhex-1-yne-3-ol | SURFYNOL ® S61 | non-ionic | alkynol |
| 21 | 2,4,7,9-Tetramethyldodec-5-yne-4,7-diol ethoxylated with 3.5 moles of EO per mole of diol | SURFYNOL ® 440 | non-ionic | alkyne diol |
| 22 | 2,4,7,9-Tetramethyldec-5-yne-4,7-diol ethoxylated with 30 moles of EO per mole of diol | SURFYNOL ® 485 | non-ionic | alkyne diol |
| 23 | 2,5,8,11-Tetramethyldodec-6-yne-5,8-diol ethoxylated with 4 moles of EO per mole of diol | SURFYNOL ® 604 | non-ionic | alkyne diol |
| 24 | P.O.E styrenated aryl ether phosphate | SINONATE ® 707P | anionic | phosphate |
| 25 | 2-(2-Nonylphenoxy)ethanol -phosphoric acid (1:1) | SINOPOL ® 9620P | non-ionic | alkylaryl alcohol |
| 26 | Polyoxyethylene tridecyl ether phosphate | RHODAFAC ® RS710 (9046-01-9) | anionic | phosphate |
| 27 | Polyoxyethylene alkyl ether carboxylate | SINONATE ® 1307CA | Anionic | Carboxylate |
| 28 | (1-dodecylpyridinium chloride hydrate) | | Cationic | Pyridinium |
| 29 | Hexadecyltrimethylammonium bromide | | Cationic | Ammonium |
| 30 | Alco4773 (35.52%) | | Cationic | Ammonium |
| 31 | poly-(diallyldimethyl ammonium chloride), 35%, average Mw <100,000 | | Cationic | Ammonium |
| 32 | poly(dimethylamine-co-epichlorohydrin-co-ethylenediamine) (PDEE), 50%, average Mw ~75,000 | | Cationic | Amine |
| 33 | poly(acrylamide-co-diallydimethyl ammonium chloride) (PAAM-DADMAC), 10% | | Cationic | Ammonium |
| 34 | poly(acrylamide) (PAM) | | Cationic | Amide |
| 35 | Cetyl trimethyl ammonium chloride (average Mw ~10,000) | | Cationic | Ammonium |

*In Table 2: CAS = Chemical Abstracts Service accession number of active component.

The SURFYNOL and ZETASPERSE brand surfactants are available from Air Products and Chemicals, Inc.; the SINOPOL and SINONATE brand surfactants are available from Sino-Japan Chemical Co., Ltd.; the OLFINE brand surfactants are available from Shin-Etsu Chemical Co.; the RHODAFAC brand surfactants are available from Rhodia; the ADEKA brand surfactants are available from Adeka Corp., the DOWFAX brand surfactants are available from Dow Chemical Co; and the ALCOSPERSE brand surfactants are available from AkzoNobel Surface Chemistry, LLC.

EXAMPLE 2

This example illustrates the effects ferric ion as oxidizing agent on TiN RR for CMP compositions comprising various surfactants.

Figure 2:
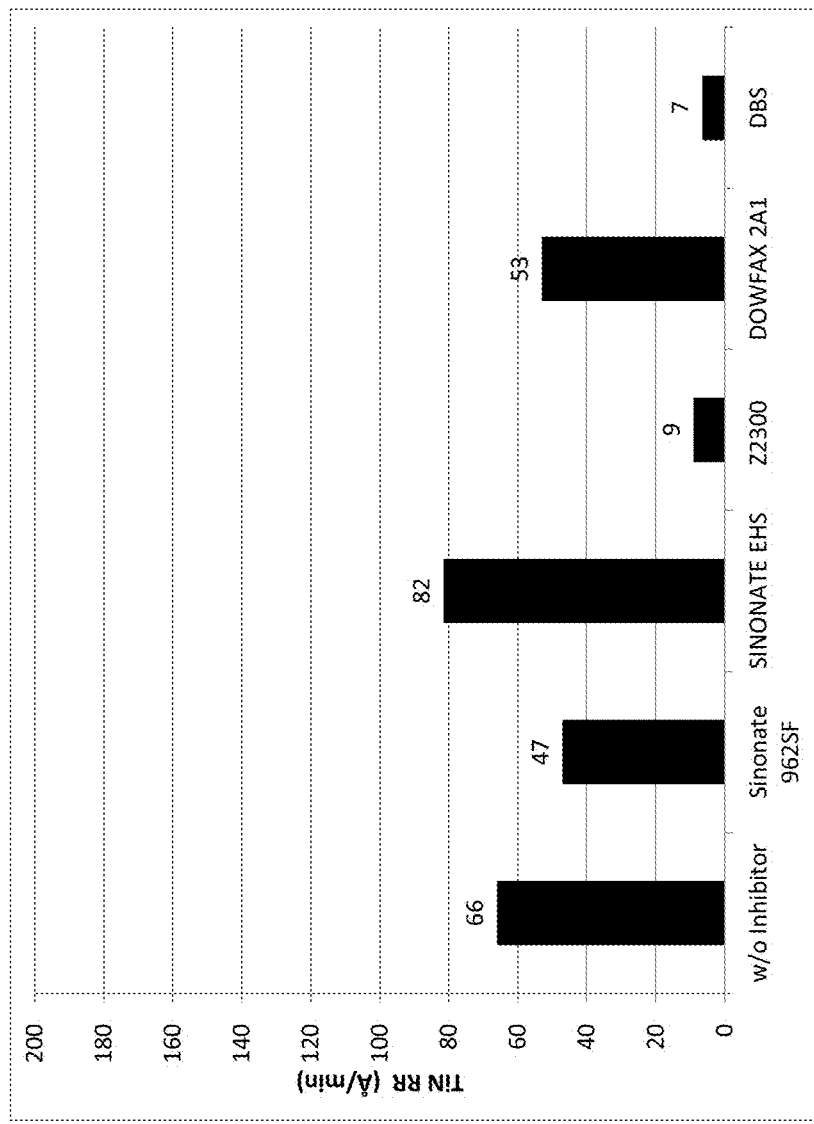
FIG. 2 provides graphs of the TiN removal rates for CMP compositions having a pH of about 2.3 and comprising about 0.025 percent by weight (wt %) of colloidal silica, about 750 ppm of ferric ion chelated with about 0.162 wt % of malonic acid, and about 1000 ppm (actives concentration) of various surfactants.

Aqueous CMP compositions having a pH of about 2.3 and comprising about 0.025 percent by weight (wt %) of colloidal silica (abrasive J from Table 1, Fuso Chemical Co. Ltd.), about 750 ppm of ferric nitrate, and about 0.162 wt % of malonic acid, additionally containing various surfactants at about 1000 ppm (on an active concentration basis) were prepared. TiN blanket wafers were polished with a polishing pad (Fujibo) and the CMP compositions, for 60 seconds using the following polishing parameters. Carrier speed of 111 rpm, platen speed of 113 rpm, down force of 1.5 psi and slurry flow rate of 150 ml. FIG. 2 provides graphs of the TiN removal rates for the various compositions, compared to a similar composition without a surfactant inhibitor.

The results in FIG. 2 show that the lowest TiN removal rates, i.e. highest TiN RR suppression, were obtained with dodecylbenzene sulfonic acid (DBS) and a mixture of (C10-C14) alkylbenzene sulfonate and ethoxylated (C6-C12) alcohols (ZETASPERSE 2300), both of which are alkylbenzene sulfonate surfactants.

EXAMPLE 3

This example illustrates the effects of abrasive solids concentration on TiN RR suppression for CMP compositions comprising a colloidal silica abrasive with and without dodecylbenzene sulfonic acid (DBS) surfactant.

Figure 3:
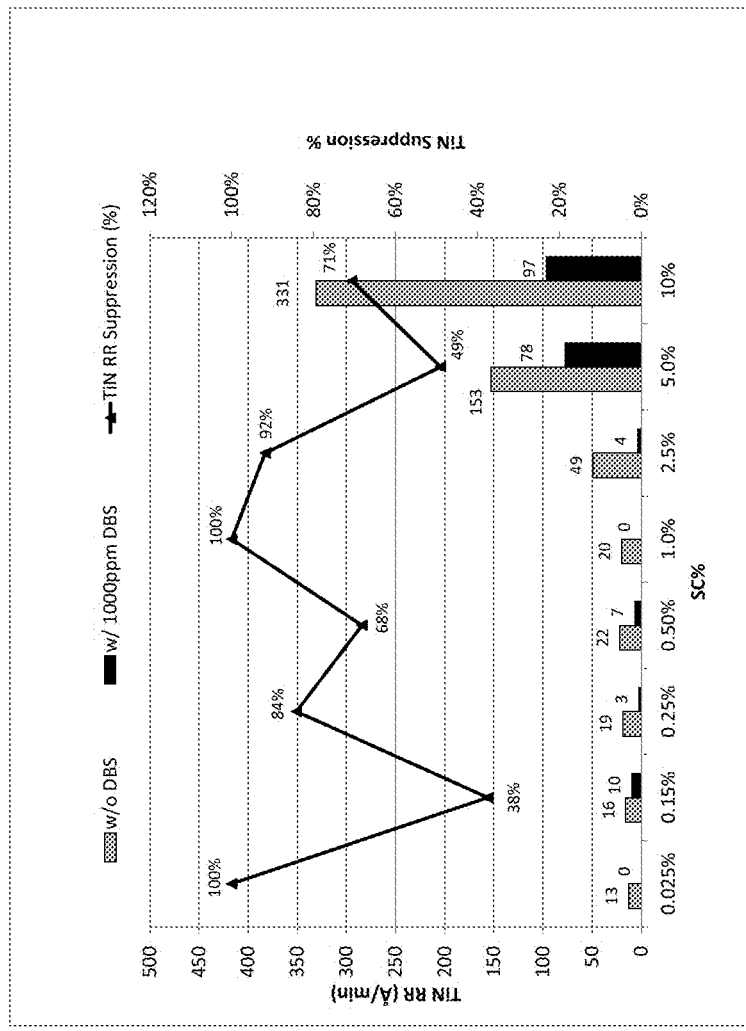
FIG. 3 provides graphs of TiN RR and TiN RR suppression (%) observed upon polishing of TiN blanket wafers with CMP compositions comprising colloidal silica with (w/) and without (w/o) 1000 ppm of dodecylbenzene sulfonic acid surfactant at various silica solids content concentrations (SC %).

Aqueous polishing slurries comprising a colloidal silica abrasive (Abrasive J from Table 1, Fuso Chemical Co.) and 0.5 wt % hydrogen peroxide at pH 2.3, with and without 1000 ppm DBS, were prepared at various abrasive solids concentrations (SC %) and evaluated by polishing TiN blanket wafers for 60 seconds using a Fujibo H7000 polishing pad and the following polishing parameters: carrier speed of 111 rpm, platen speed of 113 rpm, down force of 1.5 psi and slurry flow rate of 150 mL The polishing results are shown graphically in FIG. 3.

The data in FIG. 3 indicate that the TiN RR suppression was distributed somewhat variably in the range of about 38% to 100% over a solids concentration range of about 0.025 wt % to about 10 wt %, with the TiN RR remaining below about 50 Å/min up to a solids concentration of 2.5 wt % under the polishing conditions utilized in this evaluation. Additionally, the results indicate that even at high solids concentration (10%), which resulted in higher polishing rates, the TiN RR suppression was still high (71%).

EXAMPLE 4

This example illustrates the effect pH on TiN RR suppression for CMP compositions comprising a colloidal silica abrasive with and without dodecylbenzene sulfonic acid (DBS) surfactant.

Aqueous polishing slurries comprising a colloidal silica abrasive (Abrasive J from Table 1, Fuso Chemical Co. Ltd.) and 0.5 wt % hydrogen peroxide at pH 2.3, with and without 1000 ppm of DBS, were prepared at integral pH values from 2 to 7. The CMP compositions were evaluated by polishing TiN blanket wafers for 60 seconds using the following polishing parameters: Fujibo H7000 polishing pad, carrier speed of 111 rpm, platen speed of 113 rpm, down force of 1.5 psi and slurry flow rate of 150 mL. The polishing results are shown graphically in FIG. 4.

Figure 4:
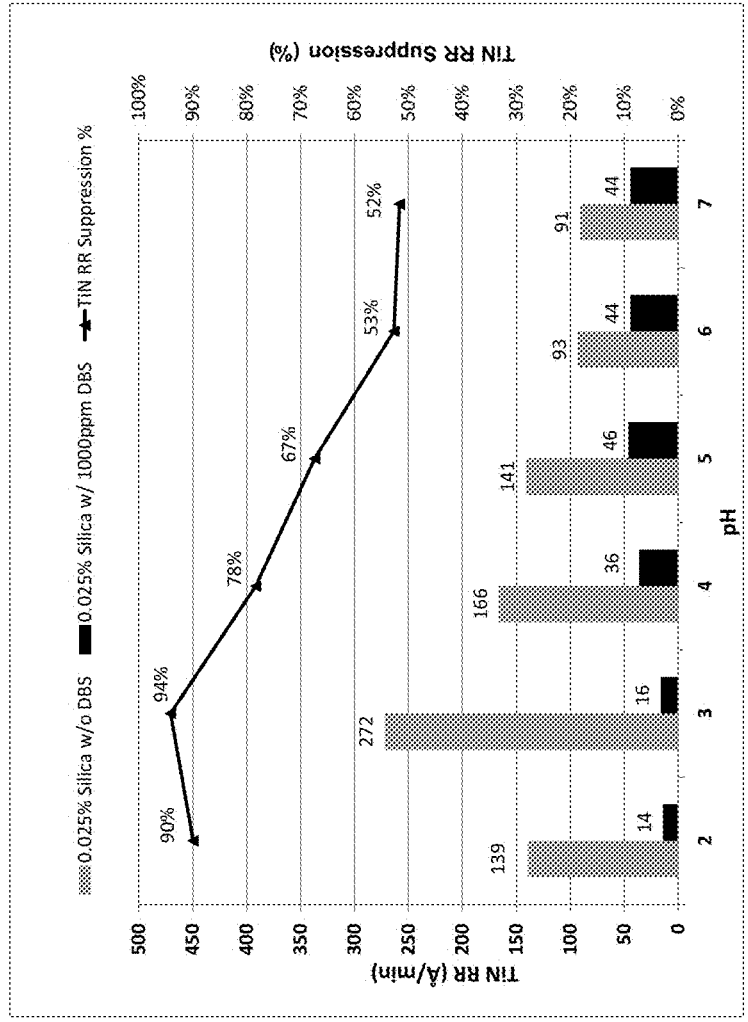
FIG. 4 provides graphs of TiN RR and TiN RR suppression (%) observed upon polishing of TiN blanket wafers with CMP compositions comprising 0.025 wt % colloidal silica with (w/) and without (w/o) 1000 ppm of dodecylbenzene sulfonic acid surfactant at various composition pH values.

The results in FIG. 4 indicate that the highest TiN RR suppression levels were attained at pH 2 and 3.

EXAMPLE 5

This example illustrates the effect of different abrasive materials on TiN RR suppression for CMP compositions with and without dodecylbenzene sulfonic acid (DBS) surfactant.

Aqueous polishing slurries comprising the 0.025 wt % of the abrasives listed in Table 1, and 0.5 wt % hydrogen peroxide at pH 2.3, with and without 1000 ppm of DBS, were prepared. The CMP compositions were evaluated by polishing TiN and W blanket wafers for 60 seconds using the following polishing parameters: Fujibo H7000 polishing pad, carrier speed of 111 rpm, platen speed of 113 rpm, down force of 1.5 psi and slurry flow rate of 150 mL. The TiN polishing results are shown graphically in FIG. 5.

Figure 5:
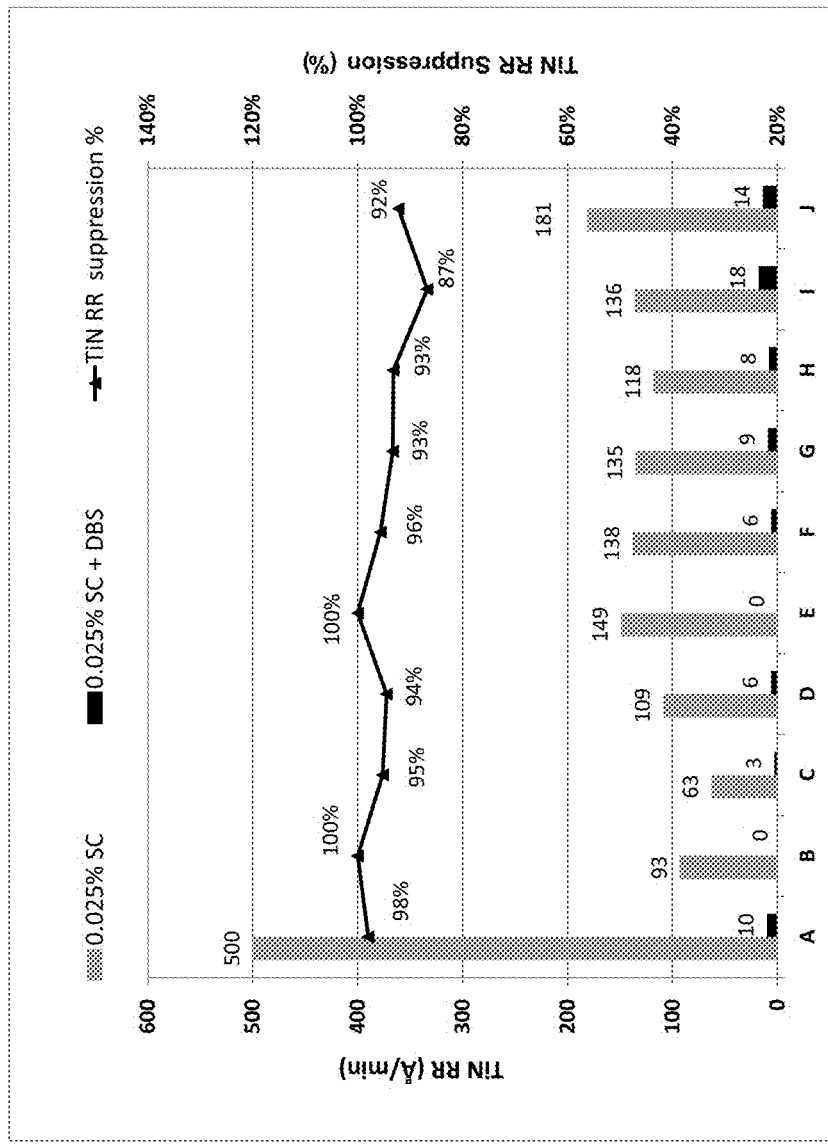
FIG. 5 provides graphs of TiN RR and TiN RR suppression (%) observed upon polishing of TiN blanket wafers with CMP compositions comprising 0.025 wt % of various abrasives with (w/) and without (w/o) 1000 ppm of dodecylbenzene sulfonic acid surfactant.

The results in FIG. 5 indicate that all of the tested abrasives showed very high TiN RR Suppression with actual TiN RR values below 20 Å/min under the evaluation conditions, for the treatments having a surfactant. The results also indicate that the TiN RR for treatments not having a surfactant varied widely, for example, from 500 to 63 Å/min.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The terms "consisting of" and "consists of" are to be construed as closed terms, which limit any compositions or methods to the specified components or steps, respectively, that are listed in a given claim or portion of the specification. In addition, and because of its open nature, the term "comprising" broadly encompasses compositions and methods that "consist essentially of" or "consist of" specified components or steps, in addition to compositions and methods that include other components or steps beyond those listed in the given claim or portion of the specification. Recitation of ranges of values herein are merely intended to serve as a shorthand method of referring individually to each separate value falling within the range, unless otherwise indicated herein, and each separate value is incorporated into the specification as if it were individually recited herein. All numerical values obtained by measurement (e.g., weight, concentration, physical dimensions, removal rates, flow rates, and the like) are not to be construed as absolutely precise numbers, and should be considered to encompass values within the known limits of the measurement techniques commonly used in the art, regardless of whether or not the term "about" is explicitly stated. All methods described herein can be performed in any suitable order unless otherwise indicated herein or otherwise clearly contradicted by context. The use of any and all examples, or exemplary language (e.g., "such as") provided herein, is intended merely to better illuminate certain aspects of the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A chemical mechanical polishing (CMP) method of polishing a substrate comprising a metal deposited over a titanium nitride (TiN) or titanium/titanium nitride (Ti/TiN) barrier layer; the method comprising contacting the substrate with an acidic CMP composition comprising a particulate abrasive suspended in a liquid carrier, wherein the particulate abrasive comprises alumina, and has a mean particle size of about 10 to about 150 nm, the liquid carrier comprising a surfactant, wherein the surfactant comprises a mixture of (C10-C14) alkylbenzene and ethoxylated (C6-C12) alcohols, wherein the surfactant suppresses a rate at which the TiN and Ti/TiN is polished, and wherein pH of the composition is in the range of about 2 to about 5.

2. The method of claim 1 wherein the particulate abrasive is present in the CMP composition at a concentration of about 0.001 to about 10 percent by weight (wt %).

3. The method of claim 1 wherein the surfactant is present in the CMP composition at a concentration in the range of about 10 to about 50,000 parts-per-million (ppm).

4. The method of claim 1 wherein the CMP composition further comprises an oxidizing agent.

5. The method of claim 4 wherein the oxidizing agent comprises hydrogen peroxide.

6. The method of claim 5 wherein the hydrogen peroxide is present in the CMP composition at a concentration in the range of about 0.01 to about 5 wt %.

7. The method of claim 1 wherein the abrading is accomplished in conjunction with a polishing pad in a CMP polishing apparatus.

8. The method of claim 1 wherein the CMP composition comprises about 0.001 to about 10 wt % of the abrasive, about 10 to about 50,000 ppm of the sulfonate surfactant, and further comprising about 0.01 to about 5 wt % of hydrogen peroxide.

* * * * *